United States Patent
Wu et al.

(10) Patent No.: US 10,403,693 B2
(45) Date of Patent: Sep. 3, 2019

(54) DISPLAY APPARATUS AND METHOD FOR PRODUCING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Hao Wu, Beijing (CN); Xiaoping Zhang, Beijing (CN); Ying Liu, Beijing (CN); Lingguo Wang, Beijing (CN); Jianguo Zhu, Beijing (CN); Hongjun Yu, Beijing (CN); Xin Wang, Beijing (CN); Na An, Beijing (CN); Baolei Guo, Beijing (CN)

(73) Assignees: BOE TECHNOLOGY GROUP CO., LTD., Beijing (CN); BEIJING BOE OTPOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/814,384

(22) Filed: Nov. 15, 2017

(65) Prior Publication Data

US 2018/0308910 A1    Oct. 25, 2018

(30) Foreign Application Priority Data

Apr. 19, 2017    (CN) .......................... 2017 1 0258395

(51) Int. Cl.
*H01L 27/32* (2006.01)
*H01L 27/02* (2006.01)
*H01L 51/52* (2006.01)
*H01L 51/56* (2006.01)
*G02F 1/1333* (2006.01)
*H01L 23/60* (2006.01)
*G02F 1/1362* (2006.01)

(52) U.S. Cl.
CPC .... *H01L 27/3244* (2013.01); *G02F 1/133308* (2013.01); *H01L 23/60* (2013.01); *H01L 27/0248* (2013.01); *H01L 27/0288* (2013.01); *H01L 27/3225* (2013.01); *H01L 51/5253* (2013.01); *H01L 51/56* (2013.01); *G02F 1/136209* (2013.01); *G02F 2001/133334* (2013.01); *G02F 2202/22* (2013.01); *H01L 2227/323* (2013.01)

(58) Field of Classification Search
CPC . H01L 27/3272; H05K 7/2039; H05K 9/0024
See application file for complete search history.

(56) References Cited

U.S. PATENT DOCUMENTS

2015/0282392 A1*  10/2015  Liu ..................... H05K 9/0024
                                                361/707

* cited by examiner

*Primary Examiner* — Changhyun Yi
(74) *Attorney, Agent, or Firm* — Kinney & Lange, P.A.

(57) ABSTRACT

A display apparatus and a method for producing the same are disclosed. The display apparatus includes a display panel, a first antistatic pattern, and an electronic component. The electronic component has a second antistatic pattern. The first antistatic pattern and the electronic component are provided at a side of the display panel away from the light-emitting side thereof in an inlaid manner.

15 Claims, 7 Drawing Sheets

DISPLAY APPARATUS AND METHOD FOR PRODUCING THE SAME

CROSS-REFERENCE TO RELATED APPLICATION

This disclosure claims the priority of Chinese Patent Application No. 201710258395.9 filed on Apr. 19, 2017, which is incorporated herein in its entirety by reference.

TECHNICAL FIELD

This disclosure relates to the technical field of display, and particularly to a display apparatus and a method for producing the same.

BACKGROUND

An active-matrix organic light emitting diode (simply referred to as: AMOLED) display apparatus comprises an AMOLED display panel.

In the related art, an antistatic layer is typically provided at a side of the AMOLED display panel, in order to reduce the electrostatic interference around the AMOLED display panel. Exemplarily, the antistatic layer may be an entire layer of copper.

In the related art, since the material of the antistatic layer is copper and the price of copper is relatively high, the production cost of the AMOLED display apparatus is relatively high.

SUMMARY

This disclosure provides a display apparatus and a method for producing the same. The technical solutions are as follows.

In one aspect, there is provided a display apparatus, comprising a display panel, a first antistatic pattern, and an electronic component,
wherein
the electronic component comprises a second antistatic pattern, and
the first antistatic pattern and the second antistatic pattern are provided at a side of the display panel away from the light-emitting side thereof in a nesting manner.

Optionally, the electronic component is a near field communication chip, and the second antistatic pattern is an electromagnetic interference shielding pattern.

Optionally, the ratio of the orthographic projection area of the first antistatic pattern on the display panel to the orthographic projection area of the second antistatic pattern on the display panel is 69:1 or less.

Optionally, a light-shielding layer is provided at a side of the display panel away from the light-emitting side thereof;
a buffering layer is provided at a side of the light-shielding layer away from the display panel;
an electromagnetic wave absorbing layer is provided at a side of the buffering layer away from the light-shielding layer;
a heat-conductive layer is provided at a side of the electromagnetic wave absorbing layer away from the buffering layer; and
the first antistatic pattern and the electronic component are provided at a side of the heat-conductive layer away from the electromagnetic wave absorbing layer.

Optionally, the electronic component further comprises an electronic component main body provided at a side of the second antistatic pattern away from the display panel.

Optionally, a protective layer is provided at a side of the display panel away from the light-emitting side thereof, and the protective layer covers the first antistatic pattern and the electronic component.

In another aspect, there is provided a method for producing the display apparatus described above, comprising the step of:
forming the first antistatic pattern and the electronic component at a side of the display panel away from the light-emitting side thereof, so that the first antistatic pattern and the second antistatic pattern are provided in a nesting manner.

Optionally, the step of forming the first antistatic pattern and the electronic component at a side of the display panel away from the light-emitting side thereof comprises the sub-steps of:
forming the first antistatic pattern at a side of the display panel away from the light-emitting side thereof; and
providing the electronic component at a side of the display panel away from the light-emitting side thereof, so that the first antistatic pattern and the second antistatic pattern are provided in a nesting manner.

Optionally, the sub-step of forming the first antistatic pattern at a side of the display panel away from the light-emitting side thereof comprises:
forming an antistatic material layer at a side of the display panel away from the light-emitting side thereof; and
treating the antistatic material layer by using a single patterning process to obtain the first antistatic pattern.

Optionally, the electronic component further comprises an electronic component main body provided at a side of the second antistatic pattern away from the display panel.

Optionally, the step of forming the first antistatic pattern and the electronic component at a side of the display panel away from the light-emitting side thereof comprises the sub-steps of:
forming an antistatic layer at a side of the display panel away from the light-emitting side thereof, wherein the antistatic layer comprises the first antistatic pattern and the second antistatic pattern; and
providing the electronic component main body at a side of the second antistatic pattern away from the display panel so as to form the electronic component together with the second antistatic pattern.

Optionally, the electronic component is a near field communication chip, and
the second antistatic pattern is an electromagnetic interference shielding pattern.

Optionally, the ratio of the orthographic projection area of the first antistatic pattern on the display panel to the orthographic projection area of the second antistatic pattern on the display panel is 69:1 or less.

Optionally, said method comprises:
forming a light-shielding layer at a side of the display panel away from the light-emitting side thereof;
forming a buffering layer at a side of the light-shielding layer away from the display panel;
forming an electromagnetic wave absorbing layer at a side of the buffering layer away from the light-shielding layer;
forming a heat-conductive layer at a side of the electromagnetic wave absorbing layer away from the buffering layer; and forming the first antistatic pattern and the electronic component at a side of the heat-conductive layer away from the electromagnetic wave absorbing layer.

Optionally, after the step of forming the first antistatic pattern and the electronic component at a side of the display panel away from the light-emitting side thereof, the method further comprises:

forming a protective layer at a side of the display panel away from the light-emitting side thereof, wherein the protective layer covers the first antistatic pattern and the electronic component.

BRIEF DESCRIPTION OF THE DRAWINGS

In order to illustrate the technical solutions in embodiments of this disclosure more clearly, figures required for describing the embodiments will be simply introduced below. It is apparent that the figures described below are merely some embodiments of this disclosure, and other figures may be further obtained by those of ordinary skill in the art according to these figures without exerting inventive work.

FIG. 1-2 is a schematic diagram of the nesting of a first antistatic pattern and an electronic component provided by an embodiment of this disclosure;

FIG. 2 is a structural schematic diagram of another display apparatus provided by an embodiment of this disclosure;

DETAILED DESCRIPTION

This disclosure at least partially solves the problem of relatively high production cost of the display apparatus. The first antistatic pattern having the antistatic function is not an entire layer of an antistatic material. A second antistatic pattern in an electronic component is nested in the first antistatic pattern. That is, the second antistatic pattern in the electronic component may cooperate as an antistatic layer of the display panel. Therefore, the amount of the antistatic material required by the entire display apparatus is reduced, and in turn the cost for producing the entire display apparatus is reduced.

In order to enable objects, technical solutions, and advantages of this disclosure to be clearer, embodiments of this disclosure will be further described in details in conjunction with accompanying drawings.

Figure 1:
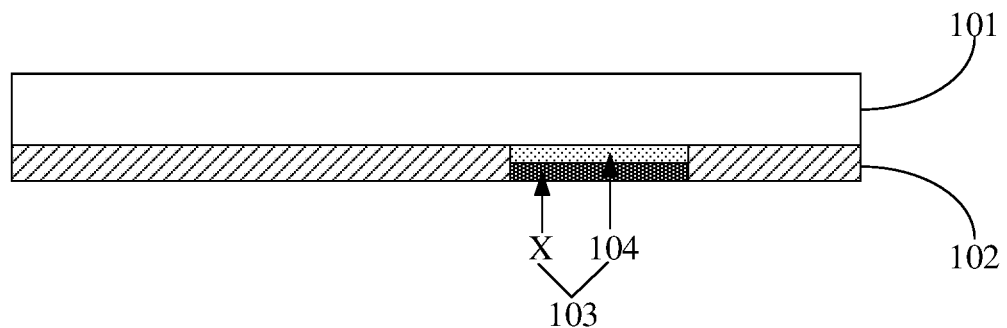
FIG. 1-1 is a structural schematic diagram of a display apparatus provided by an embodiment of this disclosure.

FIG. 1-1 is a structural schematic diagram of a display apparatus provided by an embodiment of this disclosure. As shown in FIG. 1-1, this display apparatus 10 may comprise: a display panel 101, a first antistatic pattern 102 and an electronic component 103 corresponding to the display panel 101, wherein the electronic component 103 comprises a second antistatic pattern 104 and other parts X.

The first antistatic pattern 102 and the second antistatic pattern 104 of the electronic component 103 are provided at a side of the display panel 101 away from the light-emitting side thereof in a nesting manner. In the figure, the upper region is the light-emitting side of the display panel 101.

In summary, in the display apparatus provided by an embodiment of this disclosure, the first antistatic pattern having the antistatic function is not an entire layer of an antistatic material. The second antistatic pattern in the electronic component is nested in the first antistatic pattern. That is, the second antistatic pattern in the electronic component may cooperate as an antistatic layer of the display panel. Therefore, the amount of the antistatic material required by the entire display apparatus is reduced, and in turn the cost for producing the entire display apparatus is reduced.

Figures 1, 2:
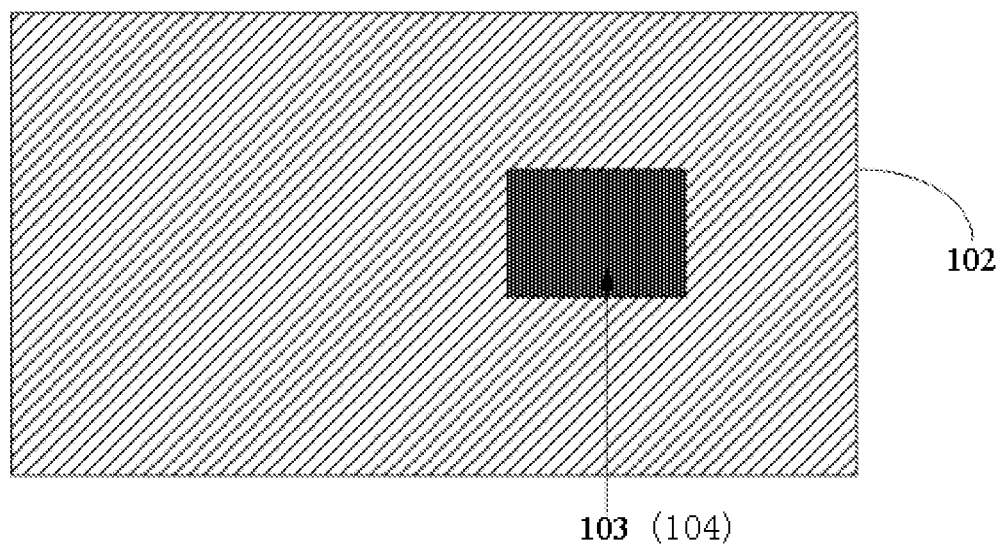
Figure 2:
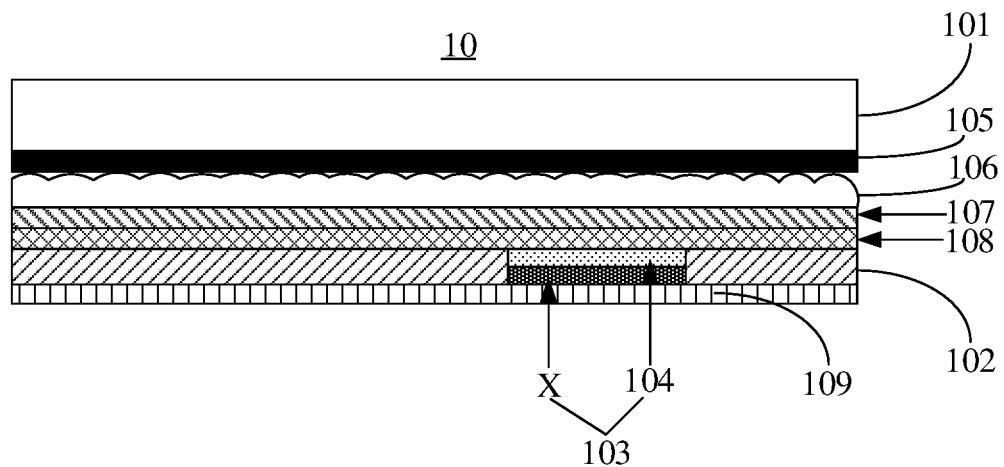

FIG. 1-2 is a schematic diagram of the nesting of a first antistatic pattern and a second antistatic pattern of an electronic component provided by an embodiment of this disclosure. As can be seen from FIG. 1-2, it is exemplified that the second antistatic pattern 104 of the electronic component 103 is nested in the first antistatic pattern 102 in an embodiment of this disclosure. In practical applications, the first antistatic pattern 102 may also be nested in the second antistatic pattern 104 of the electronic component 103. This is not limited in embodiments of this disclosure.

Exemplarily, in the figure, the electronic component 103 may be a near field communication (simply referred to as: NFC) chip, and the second antistatic pattern 104 may be an electromagnetic interference (simply referred to as: EMI) shielding pattern. The ratio of the orthographic projection area of the first antistatic pattern 102 on the display panel to the orthographic projection area of the second antistatic pattern 104 of the electronic component 103 on the display panel may be 69:1 or less. Optionally, the size of the display panel may be 100 millimeters×70 millimeters, and the size of the electronic component 103 may be 10 millimeters×10 millimeters. Correspondingly, the area of the first antistatic pattern is 6900 square millimeters, and the area of the second antistatic pattern is 100 square millimeters. The minimum distance between the edge of the electronic component 103 and the edge of the display panel may be greater than or equal to 10 millimeters. It is noted that the projection area of the electronic component main body and that of the second antistatic pattern are the same. However, they may also be different. That is, the projection area of other parts of the electronic component may be, for example, less than that of the second antistatic pattern, as long as the second antistatic pattern is nested in the first antistatic pattern. It is further noted that although the electronic component is exactly nested in the first antistatic pattern as shown in the figure, the electronic component may also be extruded from or concaved into the first antistatic layer, as long as the second antistatic pattern is nested in the first antistatic pattern.

Further, the electronic component 103 may also comprise: an electronic component main body X provided at a side of the second antistatic pattern 104 away from the display panel 101. Therefore, the electronic component main body X is effectively isolated from the display panel 101, to prevent the electromagnetic interference between the display panel 101 and the electronic component main body X. As is to be indicated, it is exemplified that the electronic component main body is provided at a side of the second antistatic pattern away from the display panel in an embodiment of this disclosure. In practical applications, the electronic component main body may also be provided at a side of the second antistatic pattern adjacent to the display panel. This is not limited in embodiments of this disclosure. Optionally, the material of the first antistatic pattern 102 may be the same as the material of the second antistatic pattern 104.

Figure 14:
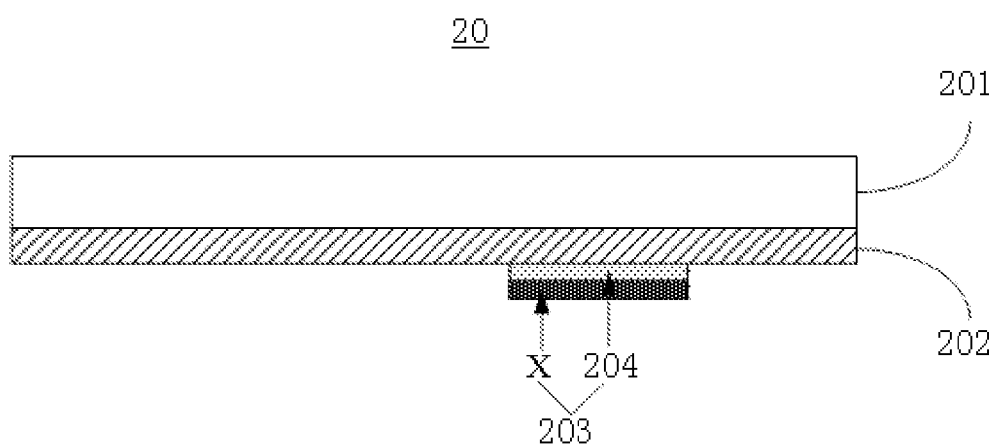
FIG. 14 is a schematic diagram of an existing display apparatus having an NFC chip.

As shown in FIG. 14, in the related art, the display apparatus 20 comprises a display panel 201 and an NFC chip 203, an antistatic layer 202 used for the display panel is provided at a side of the display panel away from the light-emitting side thereof, and the NFC chip comprises an NFC chip main body X and an EMI shielding pattern 204. However, in the related art, the antistatic layer used for the display panel and the EMI shielding pattern used for the NFC chip main body are not nested together, so that the amount of the antistatic material totally required by the display panel and the NFC chip main body is relatively large. In particular, a commonly-used antistatic layer material is a copper foil, and the price thereof is high.

However, in an embodiment of this disclosure, the first antistatic pattern 102 and the electronic component 103 are provided at a side of the display panel 101 away from the light-emitting side thereof, the electronic component 103 comprises the second antistatic pattern 104, and the first antistatic pattern 102 and the second antistatic pattern 104 of the electronic component 103 are nested with each other. The first antistatic pattern 102 and the second antistatic pattern 104 in the electronic component 103 are both used for antistatic for the display panel, while the second antistatic pattern 104 may also be used for antistatic for the electronic component main body, such the NFC chip main body. In this way, the amount of the antistatic material totally required by the display panel and the electronic component main body is relatively small, compared to the related art. Particularly, expensive copper foils are saved.

As is to be indicated, it is exemplified that the electronic component is an NFC chip in an embodiment of this disclosure. In practical applications, the electronic component may also be an electronic component other than an NFC chip. This is not limited in embodiments of this disclosure.

FIG. 2 is a structural schematic diagram of another display apparatus provided by an embodiment of this disclosure. As shown in FIG. 2, on the basis of FIG. 1-1, a light-shielding layer 105 is provided at a side of the display panel 101 away from the light-emitting side thereof; a buffering layer 106 is provided at a side of the light-shielding layer 105 away from the display panel 101; an electromagnetic wave absorbing layer 107 is provided at a side of the buffering layer 106 away from the light-shielding layer 105; a heat-conductive layer 108 is provided at a side of the electromagnetic wave absorbing layer 107 away from the buffering layer 106; and the first antistatic pattern 102 and the electronic component 103 are provided at a side of the heat-conductive layer 108 away from the electromagnetic wave absorbing layer 107.

Here, the light-shielding layer may be produced from a polyethylene terephthalate base material by a printing process. The light-shielding layer can shield a light beam, which is going to be emitted into a black matrix region of the display panel, among light beams emitted from a back light source, to improve the display effect of the display panel. The buffering layer may be a foam, and the buffering layer is used to enhance the buffering capacity of the display panel and prevent the cracking of the display panel after the shaking or collision of the display panel. The material of the heat-conductive layer may be graphite. The heat-conductive layer can conduct heat generated in the working process of the display panel to the outside of the display panel, and has the effect of dissipating heat of the display panel. Exemplarily, the material of the first antistatic pattern may be a copper foil or other conductors.

Optionally, with continued reference to FIG. 2, a protective layer 109 may be provided at a side of the display panel 101 away from the light-emitting side thereof, and the protective layer 109 covers the first antistatic pattern 102 and the electronic component 103. Exemplarily, the material of the protective layer may be an insulating material. Since the first antistatic pattern and the electronic component will be oxidized in the process of being in contact with oxygen so as to lose original properties of the first antistatic pattern and the electronic component, a protective layer, which can cover the first antistatic pattern 102 and the electronic component 103, is provided at a side of the display panel 101 away from the light-emitting side thereof. This can prevent the oxidization of the first antistatic pattern 102 and the electronic component 103. Therefore, it can be ensured that the first antistatic pattern 102 and the electronic component 103 can maintain original properties.

The light-shielding layer, the buffering layer, the electromagnetic wave absorbing layer, the heat-conductive layer, the first antistatic pattern, the electronic component, and the protective layer may be collectively called a tape structure of the display panel.

It is to be indicated that the display panel in embodiments of this disclosure may be a liquid crystal display panel, an organic light emitting diode (simply referred to as: OLED) display panel, an active-matrix organic light emitting diode (simply referred to as: AMOLED) display panel, or other types of display panels. This is not limited in embodiments of this disclosure.

In summary, in the display apparatus provided by an embodiment of this disclosure, the first antistatic pattern having the antistatic function is not an entire layer of an antistatic material. The second antistatic pattern in the electronic component is nested in the first antistatic pattern. That is, the second antistatic pattern in the electronic component may cooperate as the antistatic layer of the display panel. Therefore, the amount of the antistatic material required by the entire display apparatus is reduced, and in turn the cost for producing the entire display apparatus is reduced.

Figure 3:
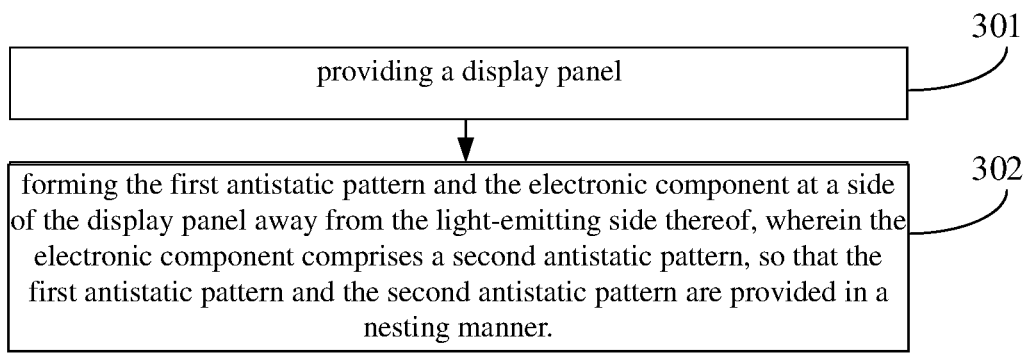
FIG. 3 is a method flow chart of a production method of a display apparatus provided by an embodiment of this disclosure.

FIG. 3 is a method flow chart of a production method of a display apparatus provided by an embodiment of this disclosure. As shown in FIG. 3, the production method of this display apparatus may comprise:

Step 301, providing a display panel; and

Step 302, forming the first antistatic pattern and the electronic component at a side of the display panel away from the light-emitting side thereof, wherein the electronic component comprises a second antistatic pattern, so that the first antistatic pattern and the second antistatic pattern are provided in a nesting manner.

In summary, in the display apparatus produced by the production method of a display apparatus provided by an embodiment of this disclosure, the first antistatic pattern having the antistatic function is not an entire layer of an antistatic material. The second antistatic pattern in the electronic component is nested in the first antistatic pattern. That is, the second antistatic pattern in the electronic component may cooperate as the antistatic layer of the display panel. Therefore, the amount of the antistatic material required by the entire display apparatus is reduced, and in turn the cost for producing the entire display apparatus is reduced.

Figure 4:
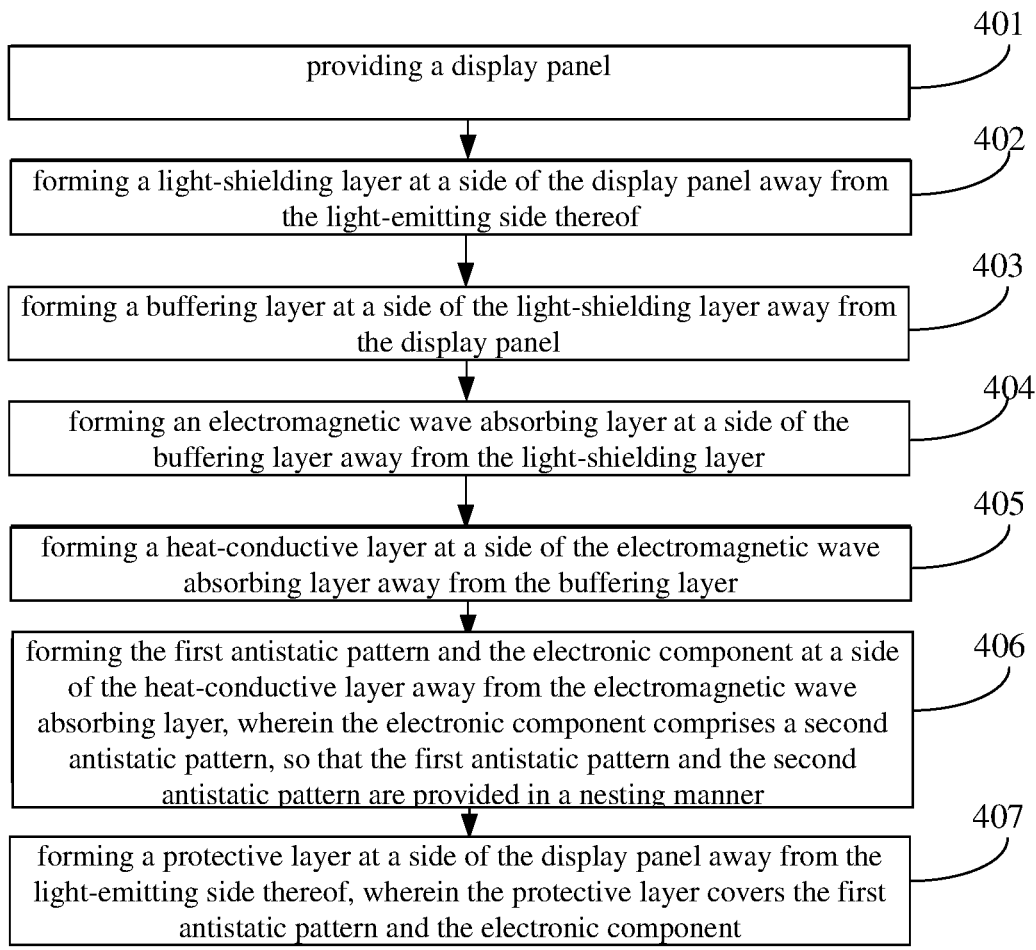
FIG. 4 is a method flow chart of a production method of another display apparatus provided by an embodiment of this disclosure.

FIG. 4 is a method flow chart of a production method of another display apparatus provided by an embodiment of this disclosure. As shown in FIG. 4, the production method of this display apparatus may comprise:

Step 401, providing a display panel.

Exemplarily, the display panel in embodiments of this disclosure may be a liquid crystal display panel, an OLED display panel, an OLED display panel, or other types of display panels. This is not limited in embodiments of this disclosure.

Step 402, forming a light-shielding layer at a side of the display panel away from the light-emitting side thereof.

Figure 5:
FIG. 5 is a schematic diagram of a partial structure of a display apparatus provided by an embodiment of this disclosure.

As shown in FIG. 5, after the display panel 101 is obtained, a light-shielding layer 105 may be formed at a side of the display panel away from the light-emitting side thereof. Exemplarily, the light-shielding layer may be produced from a polyethylene terephthalate base material by a printing process. It is to be indicated that the display panel has a light-emitting side and the side of the display panel away from the light-emitting side thereof is the opposite side of the light-emitting side.

Step 403, forming a buffering layer at a side of the light-shielding layer away from the display panel.

Figure 6:
FIG. 6 is a schematic diagram of a partial structure of another display apparatus provided by an embodiment of this disclosure.

As shown in FIG. 6, after the light-shielding layer 105 is formed, a buffering layer 106 may be formed at a side of the light-shielding layer 105 away from the display panel. The buffering layer 106 may be a foam, and the buffering layer 106 is used to enhance the buffering capacity of the display panel 101.

Step 404, forming an electromagnetic wave absorbing layer at a side of the buffering layer away from the light-shielding layer.

Figure 7:
FIG. 7 is a schematic diagram of a partial structure of yet another display apparatus provided by an embodiment of this disclosure.

As shown in FIG. 7, after the buffering layer 106 is formed, an electromagnetic wave absorbing layer 107 may be formed at a side of the buffering layer 106 away from the display panel 101.

Step 405, forming a heat-conductive layer at a side of the electromagnetic wave absorbing layer away from the buffering layer.

Figure 8:
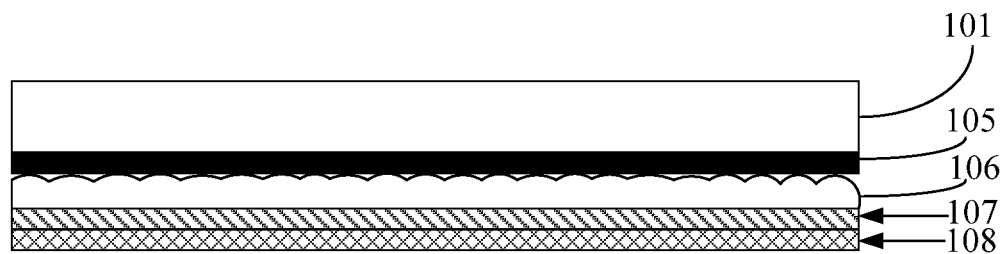
FIG. 8 is a schematic diagram of a partial structure of still another display apparatus provided by an embodiment of this disclosure.

As shown in FIG. 8, after the electromagnetic wave absorbing layer 107 is formed, a heat-conductive layer 108 may be formed at a side of the electromagnetic wave absorbing layer 107 away from the buffering layer. Exemplarily, the material of the heat-conductive layer 108 may be graphite. The heat-conductive layer 108 can have the effect of dissipating heat of the display panel 101.

Step 406, forming the first antistatic pattern and the electronic component at a side of the heat-conductive layer away from the electromagnetic wave absorbing layer, wherein the electronic component comprises a second antistatic pattern, so that the first antistatic pattern and the second antistatic pattern are provided in a nesting manner.

Exemplarily, the electronic component may be an NFC chip, and the second antistatic pattern may be an EMI shielding pattern. The ratio of the orthographic projection area of the first antistatic pattern on the display panel to the orthographic projection area of the electronic component on the display panel may be 69:1 or less. The electronic component may also comprise: an electronic component main body provided at a side of the second antistatic pattern away from the display panel. Therefore, the electronic component main body is effectively isolated from the display panel, to prevent the electromagnetic interference between the display panel and the electronic component main body.

In the related art, the display apparatus comprises a display panel and an NFC chip, an antistatic layer used for the display panel is provided at a side of the display panel away from the light-emitting side thereof, and the NFC chip comprises an NFC chip main body and an EMI shielding pattern. However, in the related art, the antistatic layer used for the display panel and the EMI shielding pattern used for the NFC chip main body are not nested together, so that the amount of the antistatic material totally required by the display panel and the NFC chip main body is relatively large.

However, in an embodiment of this disclosure, the first antistatic pattern and the electronic component comprising the second antistatic pattern are provided at a side of the display panel away from the light-emitting side thereof, and the first antistatic pattern and the electronic component are nested with each other. The first antistatic pattern and the second antistatic pattern may be both used for antistatic for the display panel, while the second antistatic pattern may also be used for antistatic for the electronic component main body, such the NFC chip main body. In this way, the amount of the antistatic material totally required by the display panel and the electronic component main body is relatively small, compared to the related art. As is to be indicated, it is exemplified that the electronic component is an NFC chip in an embodiment of this disclosure. In practical applications, the electronic component may also be an electronic component other than an NFC chip. This is not limited in embodiments of this disclosure.

Exemplarily, implementations of Step 406 may be various, and two implementations thereof are specifically analyzed in embodiments of this disclosure.

Figure 9:
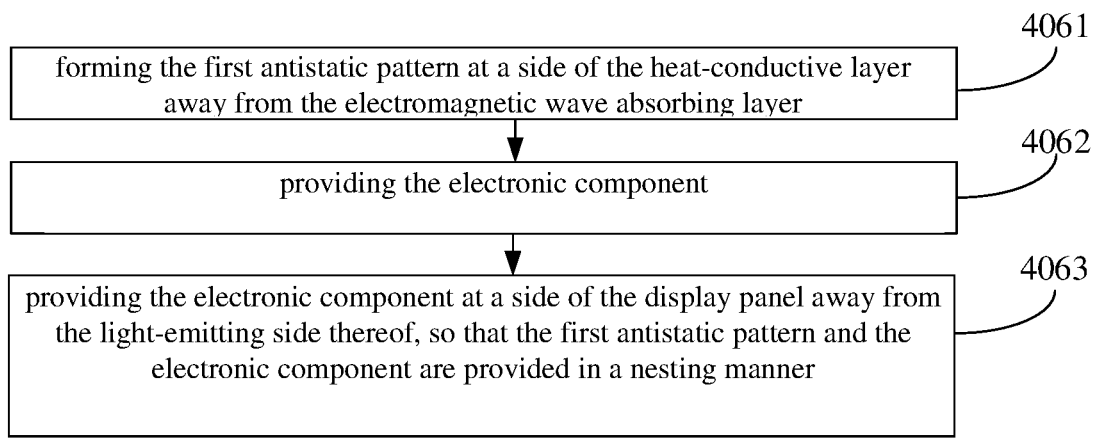
FIG. 9 is a method flow chart of forming a first antistatic pattern and an electronic component provided by an embodiment of this disclosure.

In one aspect, as shown in FIG. 9, Step 406 may comprise:

Step 4061, forming the first antistatic pattern at a side of the heat-conductive layer away from the electromagnetic wave absorbing layer.

Figure 10:
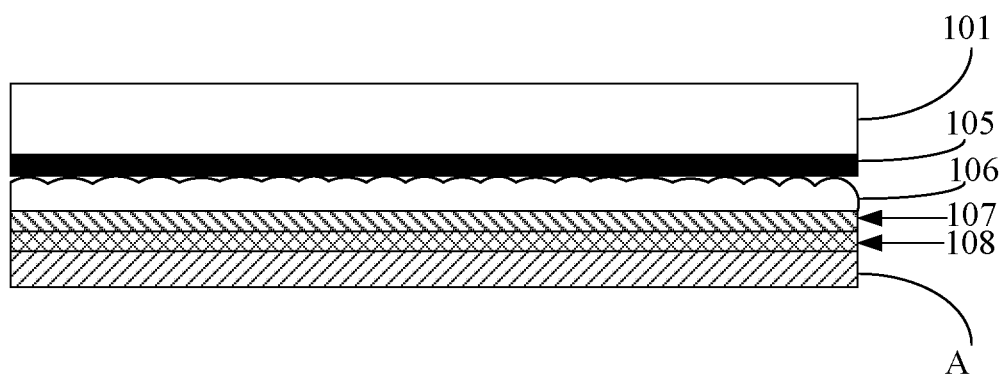
FIG. 10 is a schematic diagram of forming an antistatic material layer provided by an embodiment of this disclosure.

As shown in FIG. 10, an antistatic material layer A may be first formed at a side of the heat-conductive layer away from the display panel. Exemplarily, methods such as coating, magnetron sputtering, thermal evaporation, or plasma enhanced chemical vapor deposition may be used to deposit a layer of a metal material on a base substrate to obtain an antistatic material layer A.

Figure 11:
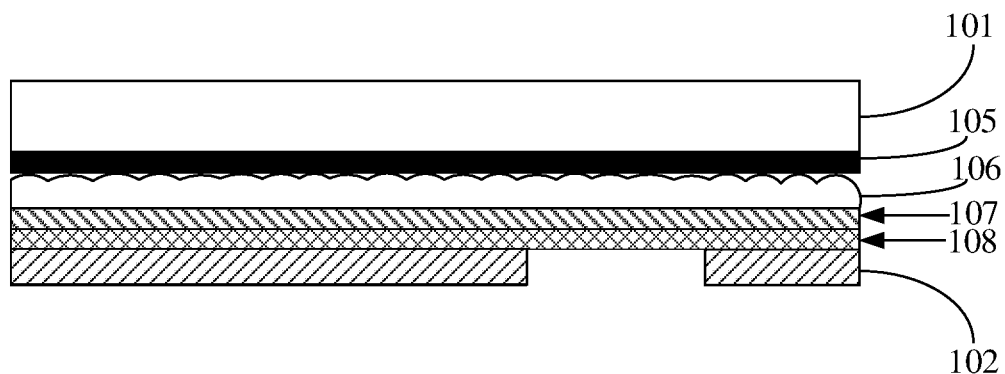
FIG. 11 is a schematic diagram of a partial structure of a display apparatus provided by another embodiment of this disclosure.

As shown in FIG. 11, after the antistatic material layer A is formed, the antistatic material layer A may be treated by using a single patterning process to obtain the first antistatic pattern 102. Here, the single patterning process comprises: photoresist coating, exposing, developing, etching, and photoresist peeling. Therefore treating the metal material layer by using a single patterning process comprises: coating a layer of a photoresist on the antistatic material layer A, exposing the photoresist by using a mask to allow the photoresist to form a fully exposed area and a non-exposed area, performing treatment by using a developing process to allow the photoresist in the fully exposed area to be removed and the photoresist in the non-exposed area to be remained, etching a corresponding area of the fully exposed area on the antistatic material layer A, and peeling the photoresist in the non-exposed area after etching to obtain a first antistatic pattern 102.

Step 4062, providing the electronic component.

Figure 12:
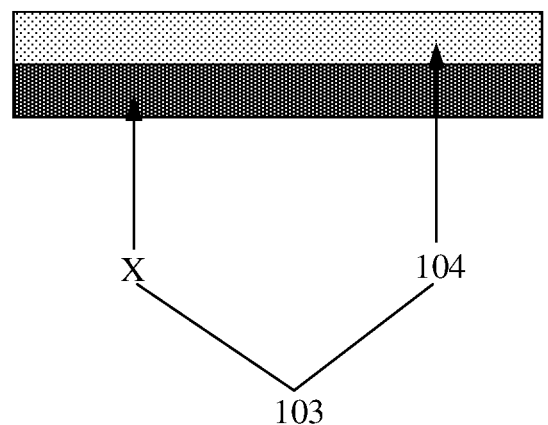
FIG. 12 is a structural schematic diagram of an electronic component provided by an embodiment of this disclosure.

As shown in FIG. 12, the electronic component 103 may comprise the electronic component main body X and the second antistatic pattern 104. Exemplarily, the electronic component may be an NFC chip, the NFC chip may comprise an NFC chip main body and an EMI shielding layer, and the NFC chip may be provided in Step 4062.

Step 4063, providing the electronic component at a side of the display panel away from the light-emitting side thereof, so that the first antistatic pattern and the electronic component are provided in a nesting manner.

Figure 13:
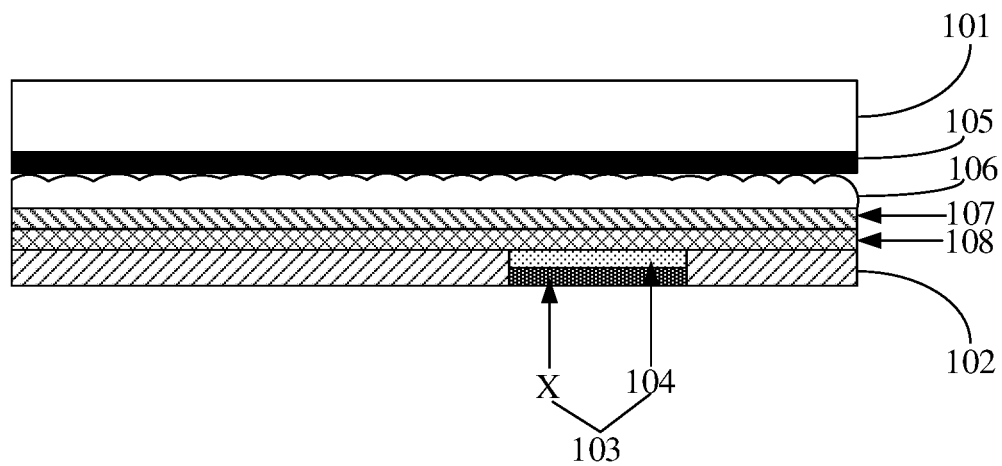
FIG. 13 is a schematic diagram of a partial structure of another display apparatus provided by another embodiment of this disclosure.

As shown in FIG. 13, in Step 4063, the electronic component may be provided at a side of the display panel away from the light-emitting side thereof, so that the first antistatic pattern 102 and the electronic component 103 can be provided in a nesting manner. As is to be indicated, it is exemplified that the second antistatic pattern 104 of the electronic component 103 is nested in the first antistatic pattern 102 in FIG. 13. In practical applications, the first antistatic pattern 102 may also be nested in the second antistatic pattern 104 of the electronic component 103. This is not limited in embodiments of this disclosure.

In another aspect, in Step 406, an antistatic layer may be first formed at a side of the heat-conductive layer away from the electromagnetic wave absorbing layer, wherein the antistatic layer comprises a first antistatic pattern and a second antistatic pattern. An electronic component main body is then required to be provided, and the electronic component main body is provided at a side of the second antistatic pattern away from the display panel.

Step 407, forming a protective layer at a side of the display panel away from the light-emitting side thereof, wherein the protective layer covers the first antistatic pattern and the electronic component.

As shown in FIG. 2, after the first antistatic pattern 102 and the electronic component 103 of the display panel 101 are formed, a protective layer 109 may be formed (such as coated) at a side of the display panel 101 away from the light-emitting side thereof, so that the protective layer 109 covers the first antistatic pattern 102 and the electronic component 103.

In summary, in the display apparatus produced by the production method of a display apparatus provided by an embodiment of this disclosure, the first antistatic pattern having the antistatic function is not an entire layer of an antistatic material. The second antistatic pattern in the electronic component is nested in the first antistatic pattern. That is, the second antistatic pattern in the electronic component may cooperate as the antistatic layer of the display panel. Therefore, the amount of the antistatic material required by the entire display apparatus is reduced, and in turn the cost for producing the entire display apparatus is reduced.

Display apparatus embodiments and production method embodiments of the display apparatus provided by embodiments of this disclosure may be referred to each other. This is not limited in embodiments of this disclosure.

The numbers of the above embodiments of this disclosure are only for the purpose of description and do not represent goodness and badness of embodiments.

It can be understood by those of ordinary skill in the art that all or a part of steps which achieve the embodiments described above may be accomplished by a hardware or may be accomplished by a program instructing a related hardware. The program may be stored in a computer-readable storage medium, and the storage medium mentioned above may be a read-only memory, a magnetic disk, an optical disk, or the like.

Those described above are merely optional embodiments of this disclosure, and are not intended to limit this disclosure. All of modifications, equivalent replacements, improvements, and the like, which are within the spirit and the principle of this disclosure, should be encompassed in the scope protected by this disclosure.

What is claimed is:

1. A display apparatus, comprising a display panel, a first antistatic pattern layer, and an electronic component, wherein:
   the display panel has a light-emitting side and a back side opposite to the light-emitting side;
   the electronic component comprises a second antistatic layer; and
   the first antistatic layer is on the back side side of the display panel,
   wherein the first antistatic layer has an opening, and the second antistatic layer is in the opening.

2. The display apparatus according to claim 1, wherein:
   the electronic component is a near field communication chip, and
   the second antistatic layer is an electromagnetic interference shielding layer.

3. The display apparatus according to claim 1, wherein a ratio of an orthographic projection area of the first antistatic layer on the display panel to an orthographic projection area of the second antistatic layer on the display panel is 69:1 or less.

4. The display apparatus according to claim 1, wherein:
   a light-shielding layer is provided on the back side of the display panel;
   a buffering layer is provided at a side of the light-shielding layer away from the display panel;
   an electromagnetic wave absorbing layer is provided at a side of the buffering layer away from the light-shielding layer;
   a heat-conductive layer is provided at a side of the electromagnetic wave absorbing layer away from the buffering layer; and
   the first antistatic layer and the electronic component are provided at a side of the heat-conductive layer away from the electromagnetic wave absorbing layer.

5. The display apparatus according to claim 1, wherein:
   the electronic component further comprises an electronic component main body provided at a side of the second antistatic layer away from the display panel.

6. The display apparatus according to claim 1, wherein:
   a protective layer is provided on the back side of the display panel; and
   the protective layer covers the first antistatic layer and the electronic component.

7. A method for producing the display apparatus of claim 1, comprising the step of:

forming the first antistatic layer and the electronic component on the back side of the display panel, so that the second antistatic layer is in the opening of the first antistatic layer.

8. The method according to claim 7, wherein the step of forming the first antistatic layer and the electronic component on the back side of the display panel comprises the sub-steps of:
    forming the first antistatic layer on the back side of the display panel; and
    providing the electronic component on the back side of the display panel, so that the second antistatic layer is in the opening of the first antistatic layer.

9. The method according to claim 8, wherein the sub-step of forming the first antistatic layer on the back side of the display panel comprises:
    forming an antistatic material layer on the back side of the display panel; and
    treating the antistatic material layer by using a single patterning process to obtain the first antistatic layer.

10. The method according to claim 7, wherein the electronic component further comprises an electronic component main body provided at a side of the second antistatic layer away from the display panel.

11. The method according to claim 10, wherein the step of forming the first antistatic layer and the electronic component on the back side of the display panel comprises the sub-steps of:
    forming an antistatic layer on the back side of the display panel, wherein the antistatic layer comprises the first antistatic layer and the second antistatic layer; and
    providing the electronic component main body at the side of the second antistatic layer away from the display panel so as to form the electronic component together with the second antistatic layer.

12. The method according to claim 7, wherein:
    the electronic component is a near field communication chip, and
    the second antistatic layer is an electromagnetic interference shielding layer.

13. The method according to claim 7, wherein a ratio of an orthographic projection area of the first antistatic layer on the display panel to an orthographic projection area of the second antistatic layer on the display panel is 69:1 or less.

14. The method according to claim 7, comprising:
    forming a light-shielding layer on the back side of the display panel;
    forming a buffering layer at a side of the light-shielding layer away from the display panel;
    forming an electromagnetic wave absorbing layer at a side of the buffering layer away from the light-shielding layer;
    forming a heat-conductive layer at a side of the electromagnetic wave absorbing layer away from the buffering layer; and
    forming the first antistatic layer and the electronic component at a side of the heat-conductive layer away from the electromagnetic wave absorbing layer.

15. The method according to claim 7, wherein after the step of forming the first antistatic layer and the electronic component on the back side of the display panel, the method further comprises:
    forming a protective on the back at the side of the display panel, wherein the protective layer covers the first antistatic layer and the electronic component.

* * * * *